(12) United States Patent
Lee et al.

(10) Patent No.: US 11,537,014 B2
(45) Date of Patent: Dec. 27, 2022

(54) DISPLAY DEVICE

(71) Applicant: Samsung Display Co., LTD., Yongin-si (KR)

(72) Inventors: Yoo Jeong Lee, Seoul (KR); Hyunseop Song, Bucheon-si (KR); Jihyun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/240,618

(22) Filed: Apr. 26, 2021

(65) Prior Publication Data
US 2021/0397033 A1 Dec. 23, 2021

(30) Foreign Application Priority Data

Jun. 22, 2020 (KR) .................. 10-2020-0075889

(51) Int. Cl.
*G02F 1/1345* (2006.01)
*H05K 1/18* (2006.01)
(52) U.S. Cl.
CPC ......... *G02F 1/13458* (2013.01); *H05K 1/189* (2013.01); *H05K 2201/10136* (2013.01)
(58) Field of Classification Search
CPC ............. G02F 1/13458; G02F 1/13452; G02F 1/1345; G02F 1/133305; G02F 1/133354; H05K 1/189; H05K 1/147; H05K 2201/10136; H05K 3/321; G09F 9/35; H01L 27/3246; H01L 27/3248 H01L 27/3276

See application file for complete search history.

(56) References Cited

U.S. PATENT DOCUMENTS

| 9,113,545 B2 | 8/2015 | Han et al. |
| 10,580,729 B2 | 3/2020 | Hsieh et al. |
| 2019/0252298 A1* | 8/2019 | Hsieh .................. H01L 23/562 |
| 2020/0068707 A1* | 2/2020 | Xia ...................... H05K 1/0281 |

FOREIGN PATENT DOCUMENTS

| JP | 2005-303172 | 10/2005 |
| JP | 4651367 | 3/2011 |
| KR | 10-1405367 | 6/2014 |
| KR | 10-1838736 | 3/2018 |
| KR | 10-2027393 | 10/2019 |

* cited by examiner

*Primary Examiner* — Anne M Hines
*Assistant Examiner* — Jose M Diaz
(74) *Attorney, Agent, or Firm* — Kile Park Reed & Houtteman PLLC

(57) ABSTRACT

A display device includes a display panel including a pixel layer displaying an image, and a pad part electrically connected to the pixel layer. The display device includes a flexible circuit film combined with the pad part of the display panel. The flexible circuit film includes a base film, a first conductive line disposed on a first surface of the base film, a first conductive pad extending from the first conductive line and electrically connected to the pad part of the display panel, a cover layer covering the first conductive line and exposing the first conductive pad, and a protrusion pattern disposed on the cover layer, adjacent to the first conductive pad, and facing a side surface of the display panel.

22 Claims, 18 Drawing Sheets

DISPLAY DEVICE

CROSS-REFERENCE TO RELATED APPLICATION(S)

This application claims priority to and benefits of Korean Patent Application No. 10-2020-0075889 under 35 U.S.C. § 119, filed on Jun. 22, 2020 in the Korean Intellectual Property Office, the entire contents of which are incorporated herein by reference.

BACKGROUND

1. Technical Field

The disclosure relates to a display device having improved bonding reliability.

2. Description of the Related Art

Various types of display devices are being used to provide image information. A display device may include a display panel displaying an image and a flexible circuit film coupled to the display panel and applying a driving signal to the display panel. The display panel may include a display area through which the image may be displayed, and panel pads may be disposed outside the display area to provide the driving signal to a display part displaying the image.

The panel pads may be electrically connected to the flexible circuit film and receive the driving signal through the flexible circuit film. Film pads may be disposed on the flexible circuit film to correspond to the panel pads. The flexible circuit film may be formed of a flexible material and may be easily deformed by heat. In particular, in case that bending occurs in the flexible circuit film due to heat generated in the process of mounting a driving chip on the flexible circuit film, connection pads and the panel pads may be misaligned.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device that may be capable of improving bonding reliability between a display panel and a flexible circuit film.

Embodiments of the inventive concept may provide a display device including a display panel including a pixel layer displaying an image, and a pad part electrically connected to the pixel layer. The display device may include a flexible circuit film combined with the pad part of the display panel.

The flexible circuit film may include a base film, a first conductive line disposed on a first surface of the base film, a first conductive pad extending from the first conductive line and electrically connected to the pad part of the display panel, a cover layer covering the first conductive line and exposing the first conductive pad, and a protrusion pattern disposed on the cover layer, adjacent to the first conductive pad, and facing a side surface of the display panel.

The protrusion pattern may include a metal pattern disposed on the cover layer and an insulating pattern covering the metal pattern.

The metal pattern, the first conductive line, and a first conductive pad may include a same material.

The insulating pattern and the cover layer may include a same material.

The protrusion pattern may have an integral structure with the cover layer.

The flexible circuit film may further include a first compensation pattern disposed on a second surface of the base film and overlapping the first conductive pad, the second surface of the base film being opposite to the first surface of the base film.

The first compensation pattern may include a first metal pattern disposed on the second surface of the base film, and a first insulating pattern covering the first metal pattern.

The first metal pattern, the first conductive line, and the first conductive pad may include a same material.

The first insulating pattern and the cover layer may include a same material.

The display device may further include a printed circuit board combined with the flexible circuit film.

The flexible circuit film may include a second conductive line disposed on the first surface of the base film, and a second conductive pad extending from the second conductive line and combined with the printed circuit board.

The flexible circuit film may further include a second compensation pattern disposed on the second surface of the base film and overlapping the second conductive pad, the second surface of the base film being opposite to the first surface of the base film.

The second compensation pattern may include a second metal pattern disposed on a second surface opposite to the first surface of the base film, and a second insulating pattern covering the second metal pattern.

The display device may further include a driving chip disposed on the flexible circuit film.

The protrusion pattern may have a bar shape extending along the driving chip.

The flexible circuit film may include a first compensation pattern and a second compensation pattern that are spaced apart from each other, and the driving chip may be disposed between the first compensation pattern and the second compensation pattern.

The first compensation pattern and the second compensation pattern may have a bar shape extending along the driving chip.

Embodiments of the inventive concept may provide a display device including a display panel including a pixel layer displaying an image, and a pad part electrically connected to the pixel layer. The display device may include a flexible circuit film combined with the pad part of the display panel, and a printed circuit board combined with the flexible circuit film.

The flexible circuit film may include a base film, a first conductive line disposed on a first surface of the base film, a first conductive pad extending from the first conductive line and electrically connected to the pad part of the display panel, a cover layer covering the first conductive line and exposing the first conductive pad, and a first compensation pattern disposed on a second surface of the base film, the second surface of the base film being opposite to the first surface of the base film.

The first compensation pattern may overlap the first conductive pad.

The flexible circuit film may further include a second conductive line disposed on the first surface of the base film, a second conductive pad extending from the second conductive line and combined with the printed circuit board, and a second compensation pattern disposed on the second surface of the base film and overlapping the second conductive pad.

According to the above, a misalignment between the display panel and the flexible circuit film and flexural deformation of the flexible circuit film may be prevented, and thus, bonding reliability of the display device may be improved.

BRIEF DESCRIPTION OF THE DRAWINGS

The above and other advantages of the disclosure will become readily apparent by reference to the following detailed description when considered in conjunction with the accompanying drawings wherein.

DETAILED DESCRIPTION OF THE EMBODIMENTS

Figure 1:
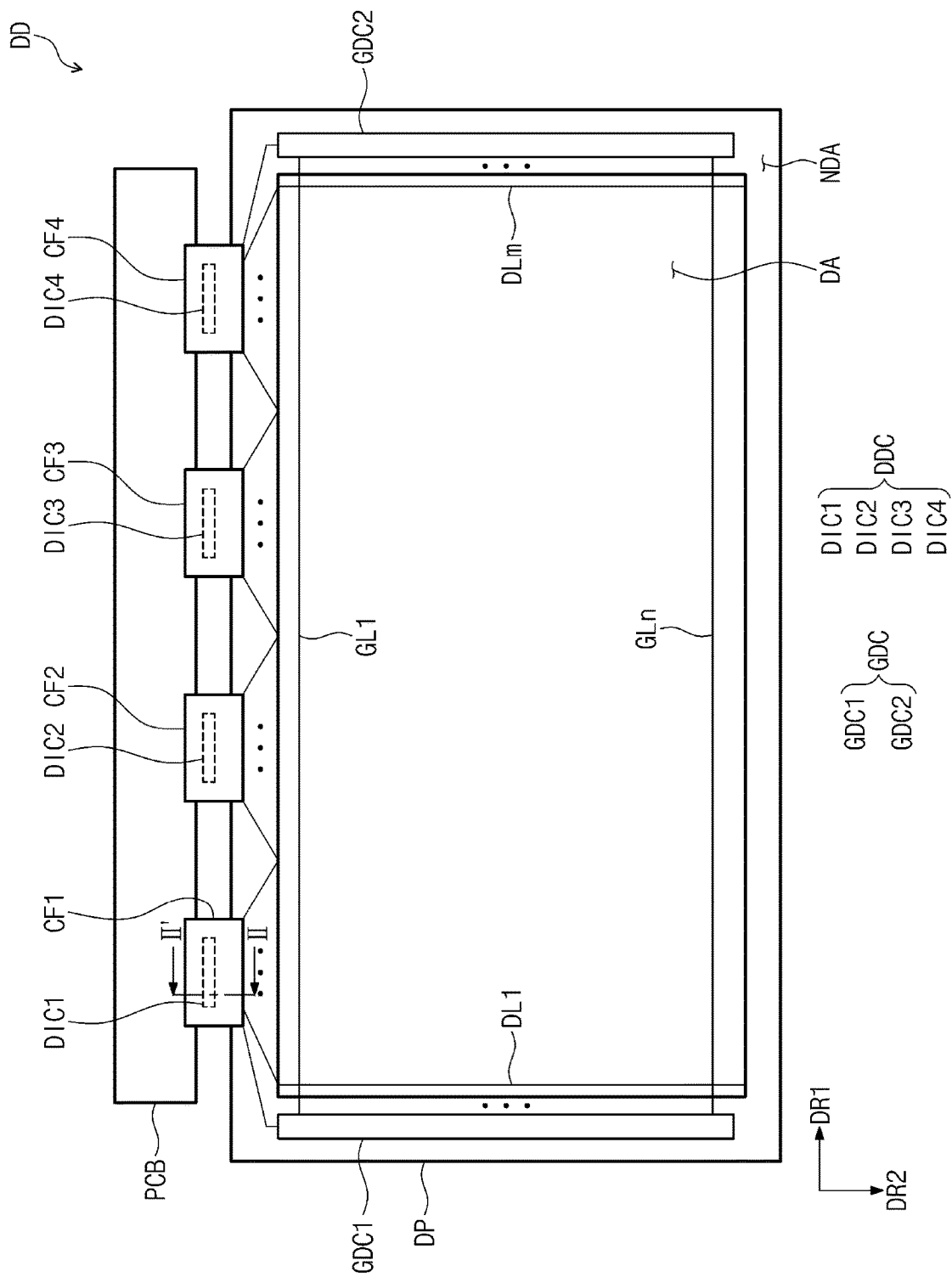
FIG. 1 is a schematic plan view showing a display device according to an embodiment of the disclosure.

Hereinafter, the disclosure will be explained in detail with reference to the accompanying drawings.

In the disclosure, it will be understood that when an element or layer is referred to as being "on", "connected to" or "coupled to" another element or layer, it can be directly on, connected or coupled to another element or layer or intervening elements or layers may be present.

Like numerals refer to like elements throughout. In the drawings, the thickness, ratio, and dimension of components may be exaggerated for effective description of the technical content.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

The term overlap may include layer, stack, face or facing, extending over, extending under, covering or partly covering or any other suitable term as would be appreciated and understood by those of ordinary skill in the art.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the disclosure. As used herein, the singular forms, "a", "an" and "the" are intended to include the plural forms as well, unless the context clearly indicates otherwise.

Spatially relative terms, such as "beneath", "below", "lower", "above", "upper" and the like, may be used herein for ease of description to describe one element or feature's relationship to another element(s) or feature(s) as illustrated in the figures.

It will be further understood that terms such as "comprises", "has" and "includes" specify the presence of stated features, integers, steps, operations, elements, and/or components, but do not preclude the presence or addition of one or more other features, integers, steps, operations, elements, components, and/or groups thereof.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2A:
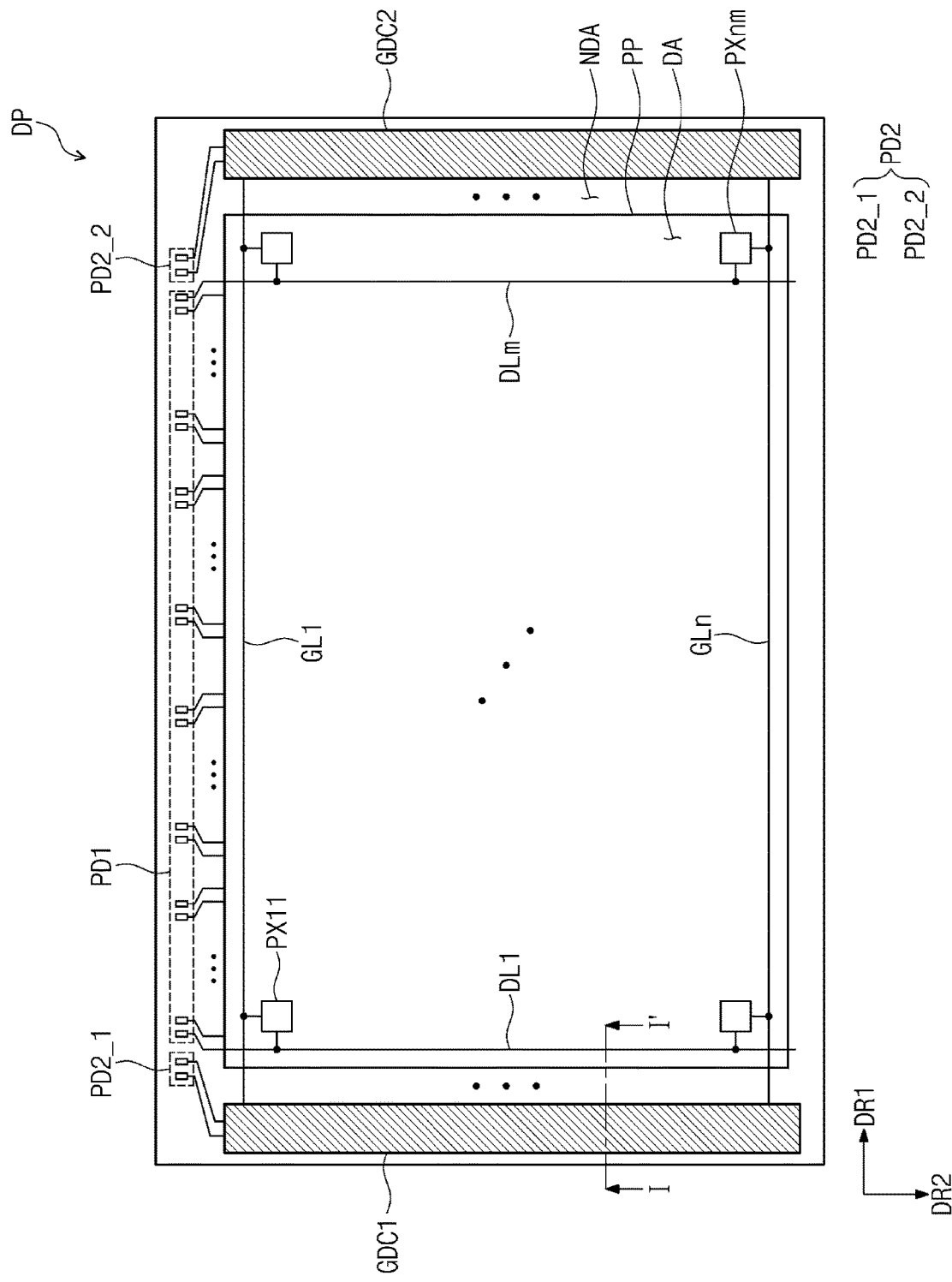
FIG. 2A is a schematic plan view showing a display panel according to an embodiment of the disclosure.
Figure 2B:
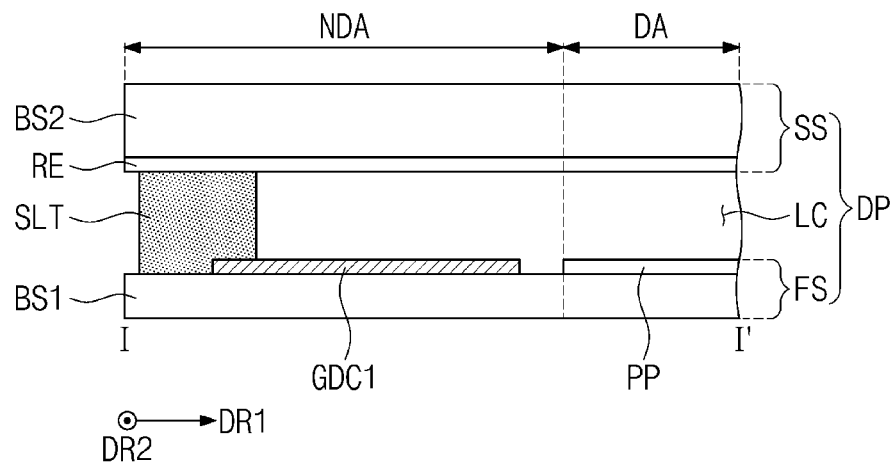
FIG. 2B is a schematic cross-sectional view taken along line I-I' shown in FIG. 2A.
Figure 2C:
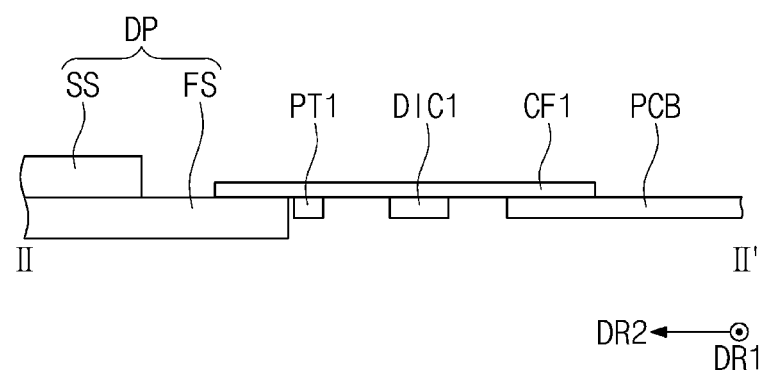
FIG. 2C is a schematic cross-sectional view taken along line II-IF shown in FIG. 1.

FIG. 1 is a schematic plan view showing a display device DD according to an embodiment of the disclosure. FIG. 2A is a schematic plan view showing a display panel DP according to an embodiment of the disclosure, FIG. 2B is a schematic cross-sectional view taken along line I-I' shown in FIG. 2A, and FIG. 2C is a schematic cross-sectional view taken along line II-II' shown in FIG. 1.

Referring to FIGS. 1 and 2A to 2C, the display device DD may include the display panel DP displaying an image and a panel driver driving the display panel DP. As an example, the panel driver may include a gate driver GDC and a data driver DDC.

The display panel DP may include a display area DA displaying the image and a non-display area NDA defined adjacent to the display area DA. The display area DA may be an area through which the image may be substantially displayed, and the non-display area NDA may be an area through which the image may not be displayed. FIG. 1 shows a structure in which the non-display area NDA surrounds the display area DA, however, the disclosure should not be limited thereto or thereby. The non-display area NDA may be defined adjacent to at least one side of the display area DA.

The display panel DP may include gate lines GL1 to GLn, data lines DL1 to DLm, and pixels PX11 to PXnm. The gate lines GL1 to GLn may extend in a first direction DR1 and may be arranged in a second direction DR2 crossing the first direction DR1 to be substantially parallel to each other. As an example, the second direction DR2 may be substantially perpendicular to the first direction DR1. The data lines DL1 to DLm may be arranged in the first direction DR1 to be substantially parallel to each other and extend in the second direction DR2.

The pixels PX11 to PXnm may be arranged in the first and second directions DR1 and DR2 in the display area DA. As an example, the pixels PX11 to PXnm may be arranged in a matrix form. Each of the pixels PX11 to PXnm may be electrically connected to one of the gate lines GL1 to GLn and one of the data lines DL1 to DLm. Each of the pixels PX11 to PXnm may be turned on in response to a gate signal applied thereto through a corresponding gate line and receive a data voltage applied thereto through a corresponding data line to display the image corresponding to, e.g., a desired grayscale.

The gate driver GDC may sequentially output gate signals to the gate lines GL1 to GLn. Accordingly, the pixels PX11 to PXnm may be sequentially scanned by the gate signals by row. As an example, the gate driver GDC may include a first gate driver GDC1 and a second gate driver GDC2. The first gate driver GDC1 may be electrically connected to ends of the gate lines GL1 to GLn, and the second gate driver GDC2 may be electrically connected to other ends of the gate lines GL1 to GLn. Each of the first and second gate drivers GDC1 and GDC2 may include a shift register that sequentially outputs the gate signals. The first and second gate drivers GDC1 and GDC2 may be substantially simultaneously driven and output the gate signals to the same gate lines. Accordingly, each of the gate lines GL1 to GLn may receive the gate signals from the first and second gate drivers GDC1 and GDC2 through opposite ends thereof.

FIGS. 1 and 2A show a structure in which two gate drivers GDC1 and GDC2 may be electrically connected to opposite ends of the gate lines GL1 to GLn, respectively. However, the disclosure should not be limited thereto or thereby. For example, the display device DD may employ a structure in which only one gate driver of the first and second gate drivers GDC1 and GDC2 may be electrically connected to the gate lines GL1 to GLn.

The first and second gate drivers GDC1 and GDC2 may be built in the display panel DP. For example, the first and second gate drivers GDC1 and GDC2 may be formed in the non-display area NDA of the display panel DP through a thin film process that forms the pixels PX11 to PXnm in the display area DA of the display panel DP.

The data driver DDC may convert image signals to data voltages and the data voltages to the data lines DL1 to DLm of the display panel DP. The data driver DDC may include data driving chips DIC1 to DIC4. Each of the data driving chips DIC1 to DIC4 may be electrically connected to corresponding data lines among the data lines DL1 to DLm. FIG. 1 shows four data driving chips DIC1 to DIC4, however, the number of the data driving chips DIC1 to DIC4 should not be particularly limited.

The display device DD further includes flexible circuit films CF1 to CF4 and a printed circuit board PCB. The flexible circuit films CF1 to CF4 may be provided between the display panel DP and the printed circuit board PCB and electrically connect the display panel DP to the printed circuit board PCB. An end of each of the flexible circuit films CF1 to CF4 may be coupled to the display panel DP, and another end of each of the flexible circuit films CF1 to CF4 may be coupled to the printed circuit board PCB.

FIG. 1 shows a structure in which the data driving chips DIC1 to DIC4 may be respectively mounted on the flexible circuit films CF1 to CF4, however, the disclosure should not be limited thereto or thereby. For example, the data driving chips DIC1 to DIC4 may be mounted on (e.g., directly on) the display panel DP in a chip-on-glass (COG) method.

Various circuits that may generate various control signals and power signals that may be required to drive the display panel DP and the panel driver may be arranged on the printed circuit board PCB.

The display panel DP may further include a first pad part PD1 and a second pad part PD2. The first and second pad parts PD1 and PD2 may be arranged in the non-display area NDA. The first pad part PD1 may include data pads electrically connected to the data lines DL1 to DLm. The first pad part PD1 may be coupled to the flexible circuit films CF1 to CF4 and receive the data voltages from the data driving chips DIC1 to DIC4 mounted on the flexible circuit films CF1 to CF4.

The second pad part PD2 may include a first driving pad part PD2_1 electrically connected to the first gate driver GDC1 and a second driving pad part PD2_2 electrically connected to the second gate driver GDC2. The first driving pad part PD2_1 may include first driving pads to apply a first gate driving signal to the first gate driver GDC1, and the second driving pad part PD2_2 may include second driving pads to apply a second gate driving signal to the second gate driver GDC2.

The second pad part PD2 may be connected to a portion of the flexible circuit films CF1 to CF4. As an example, the first driving pads part PD2_1 may be connected to a first flexible circuit film CF1 among the flexible circuit films CF1 to CF4, and the second driving pads part PD2_2 may be connected to a fourth flexible circuit film CF4 among the flexible circuit films CF1 to CF4. The first gate driving signal may be a signal output from a first data driving chip DIC1 mounted on the first flexible circuit film CF1 or a signal provided from the printed circuit board PCB. The second gate driving signal may be a signal output from a fourth data driving chip DIC4 mounted on the fourth flexible circuit film CF4 or a signal provided from the printed circuit board PCB.

Although not shown in figures, the display device DD may further include a light emitting part providing a light to the display panel DP. The light emitting part may emit light itself, such as in the case of an organic light emitting diode (OLED). In case that the display panel DP is a liquid crystal display panel that does not emit light itself, the light emitting part may be disposed at a rear side of the liquid crystal display panel and provide the light to the liquid crystal display panel. Each pixel PX11 to PXnm may control a transmittance of the light provided from the light emitting part to display the image having, e.g., the desired grayscale.

Referring to FIGS. 2A and 2B, the display panel DP may include a first display substrate FS, a second display substrate SS, and a liquid crystal layer LC. The first display substrate FS may include a first base substrate BS1 and a pixel layer PP disposed on the first base substrate BS1. The pixel layer PP may include a thin film transistor, a pixel electrode, and insulating layers, which form each pixel PX11 to PXnm. The pixel layer PP may be provided to correspond to the display area DA of the display panel DP. The first and second gate drivers GDC1 and GDC2 may be disposed on the first base substrate BS1 to correspond to the non-display area NDA.

The second display substrate SS may include a second base substrate BS2 and a reference electrode RE. The second base substrate BS2 may be disposed to face the first base substrate BS1. The liquid crystal layer LC may be interposed between the first and second display substrates FS and SS. The reference electrode RE may be disposed on the second base substrate BS2 with the liquid crystal layer LC interposed therebetween to face the pixel electrode. A reference voltage may be applied to the reference electrode RE. The reference electrode RE may be disposed on an entire back surface of the second base substrate BS2. Accordingly, the reference electrode RE may face the first and second gate drivers GDC1 and GDC2 in the non-display area NDA. The second display substrate SS may further include a color filter layer and a black matrix layer.

The display panel DP may further include a sealant SLT disposed in the non-display area NDA to combine the first and second display substrates FS and SS. A space between the first and second display substrates FS and SS may be sealed by the sealant SLT. The first and second gate drivers GDC1 and GDC2 may overlap the sealant SLT.

Referring to FIGS. 1 to 2C, an end of each of the first to fourth flexible circuit films CF1 to CF4 may be coupled to the display panel DP, and another end of each of the first to fourth flexible circuit films CF1 to CF4 may be coupled to the printed circuit board PCB.

As an example, the display panel DP may have a quadrangular shape in plan view. The flexible circuit films CF1 to CF4 may be combined with a side of the display panel DP. In particular, the flexible circuit films CF1 to CF4 may be combined on the first display substrate FS of the display panel DP. The first display substrate FS may extend more than the second display substrate SS to be combined with the flexible circuit films CF1 to CF4. The first and second pad parts PD1 and PD2 may be disposed on the first display substrate FS and exposed without being covered by the second display substrate SS. The flexible circuit films CF1 to CF4 may be electrically connected to the first and second pad parts PD1 and PD2 provided on the first display substrate FS.

As an example, the flexible circuit films CF1 to CF4 may include a material having flexibility. The data driving chips DIC1 to DIC4 may be mounted on corresponding flexible circuit films CF1 to CF4, respectively. For example, the first data driving chip DIC1 may be mounted on the first flexible circuit film CF1. The first data driving chip DIC1 may be disposed between an end and another end of the first flexible circuit film CF1.

The flexible circuit films CF1 to CF4 may be arranged to be spaced apart from each other in the first direction DR1. Each of the data driving chips DIC1 to DIC4 may extend in the first direction DR1. Each of the flexible circuit films CF1 to CF4 may be bent such that the printed circuit board PCB may be disposed on the back surface of the display panel DP.

Each of the flexible circuit films CF1 to CF4 may include a protrusion pattern PT1 facing a side surface of the display panel DP. The protrusion pattern PT1 may face a side surface of the first display substrate FS. In case that a bonding process is performed to combine the flexible circuit films CF1 to CF4 to the display panel DP, positions of the flexible circuit films CF1 to CF4 may be guided by the protrusion pattern PT1. In detail, the protrusion pattern PT1 that extends along the first data driving chip DIC1 may be provided on the first flexible circuit film CF1. In case that the first flexible circuit film CF1 is combined with the display panel DP, the protrusion pattern PT1 may be disposed to face the side surface of the first display substrate FS to restrict a movement of the first flexible circuit film CF1 in a y-axis direction. The y-axis direction may be substantially parallel to the second direction DR2.

Figure 3A:
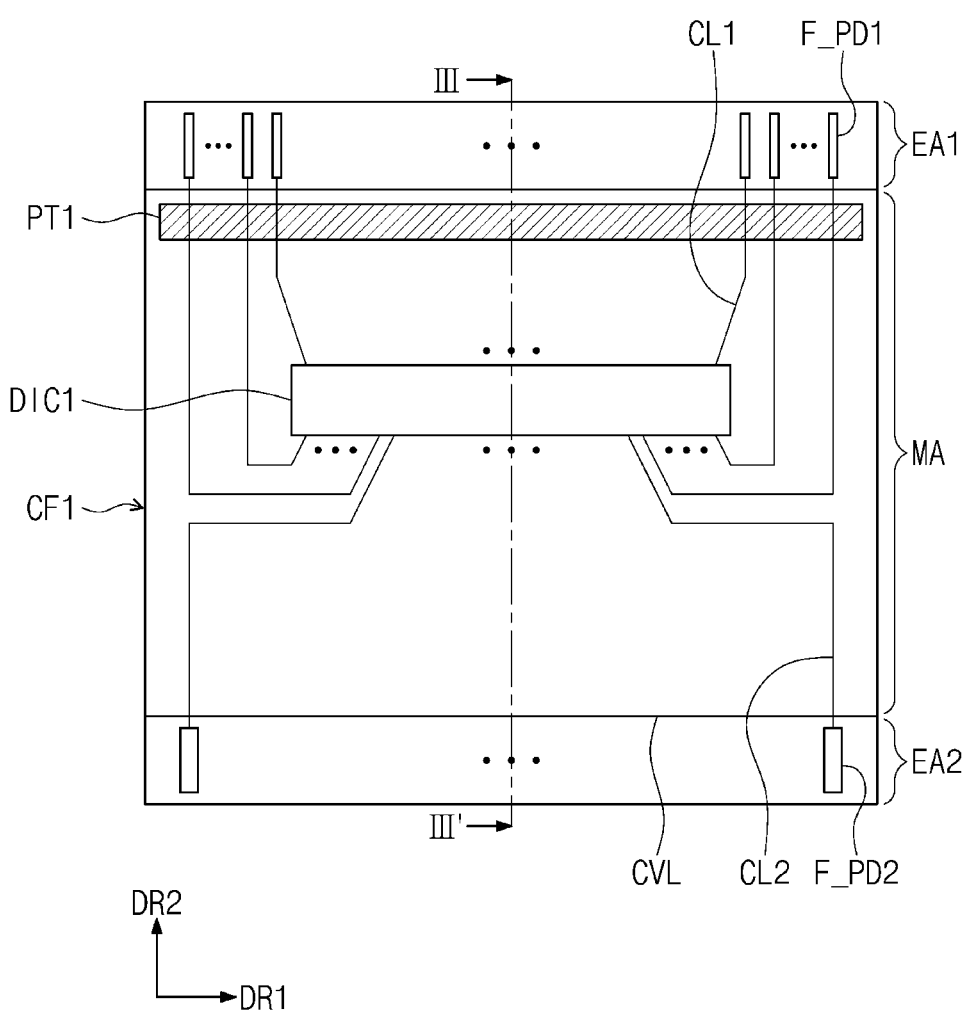
FIG. 3A is a schematic plan view showing a first flexible circuit film according to an embodiment of the disclosure.
Figure 3B:
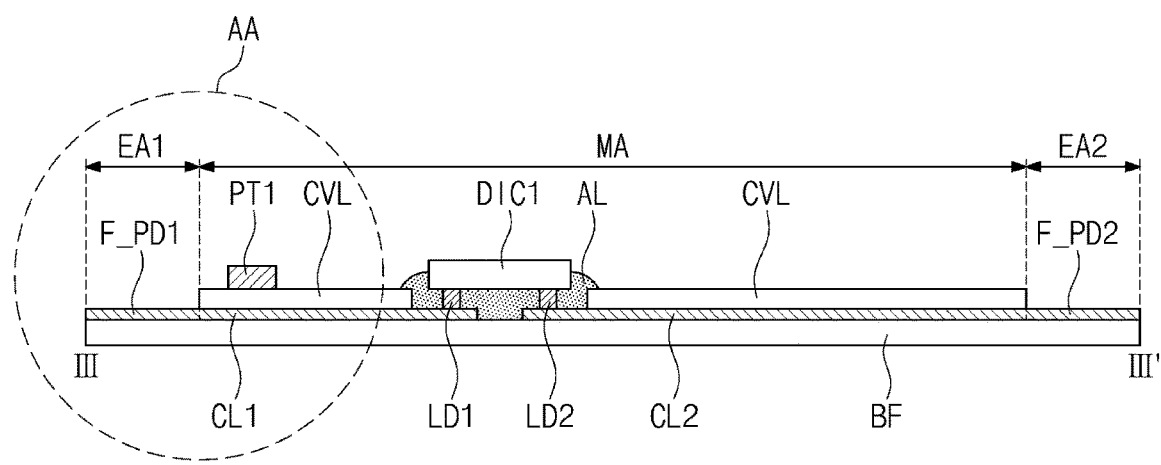
FIG. 3B is a schematic cross-sectional view taken along line shown in FIG. 3A.
Figure 3C:
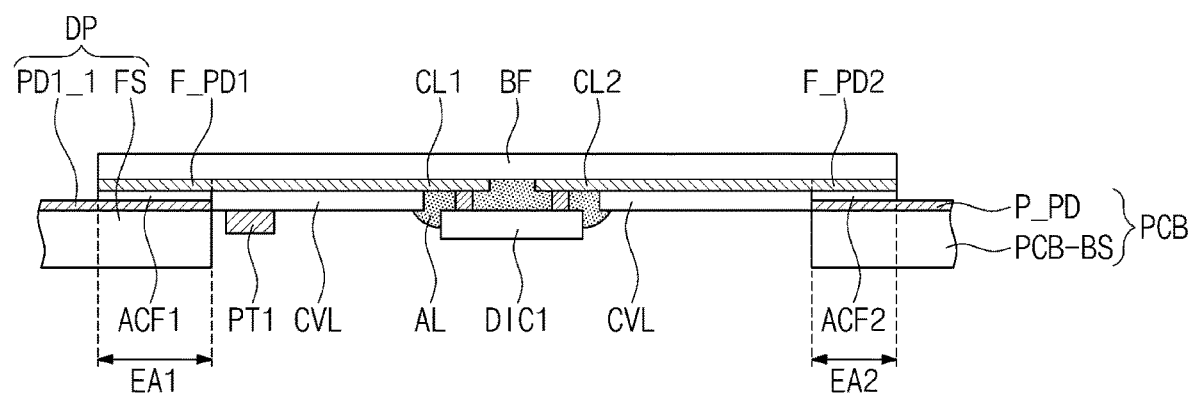
FIG. 3C is a schematic cross-sectional view showing a state in which the first flexible circuit film shown in FIG. 3A, the display panel, and a printed circuit board may be combined with each other.
Figure 3D:
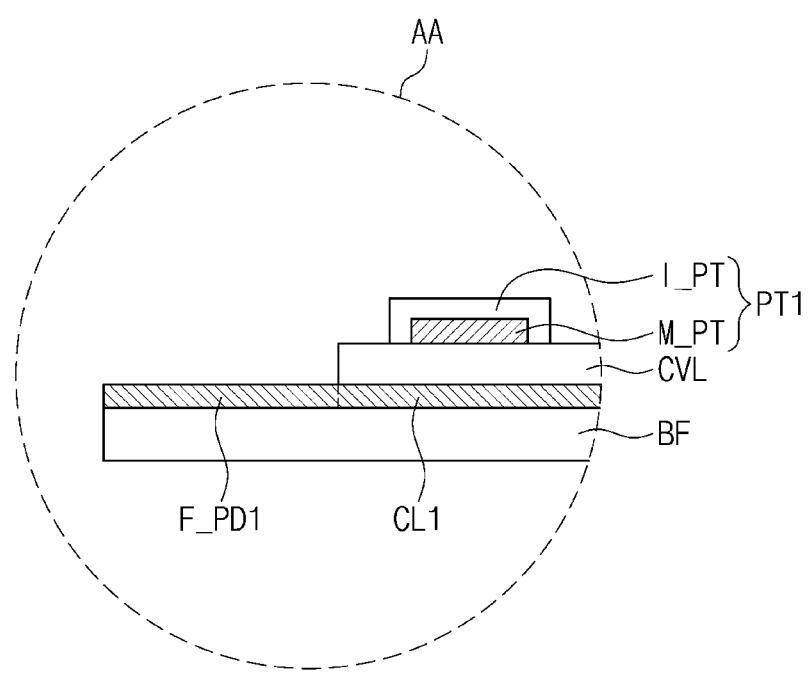
FIG. 3D is a partially enlarged schematic cross-sectional view showing portion AA shown in FIG. 3B.

FIG. 3A is a schematic plan view showing the first flexible circuit film according to an embodiment of the disclosure, and FIG. 3B is a schematic cross-sectional view taken along line III-III' shown in FIG. 3A. FIG. 3C is a schematic cross-sectional view showing a state in which the first flexible circuit film shown in FIG. 3A, the display panel, and the printed circuit board may be combined with each other, and FIG. 3D is a partially enlarged schematic cross-sectional view showing portion AA shown in FIG. 3B.

Referring to FIGS. 3A and 3B, the first flexible circuit film CF1 may include a base film BF, first conductive lines CL1, and second conductive lines CL2.

The base film BF may include a polymer material, e.g., polyimide, polyester, or a combination thereof. The base film BF may be flexible. The first and second conductive lines CL1 and CL2 may be disposed on the base film BF.

The first flexible circuit film CF1 may include a center area MA, a first pad area EA1 defined at a first side of the center area MA, and a second pad area EA2 defined at a second side of the center area MA. The first data driving chip DIC1 may be mounted on the center area MA of the first flexible circuit film CF1.

The first conductive lines CL1 may be electrically connected to the first data driving chip DIC1 in the center area MA, and the second conductive lines CL2 may be electrically connected to the first data driving chip DIC1 in the center area MA. The first data driving chip DIC1 may include first bumps LD1 and second bumps LD2. The first bumps LD1 may be electrically connected to the first conductive lines CL1, respectively, and the second bumps LD2 may be electrically connected to the second conductive lines CL2, respectively. The first data driving chip DIC1 may be combined with the first flexible circuit film CF1 through an encapsulation adhesive layer AL.

The first flexible circuit film CF1 may further include first conductive pads F_PD1 extending from the first conductive lines CL1 and second conductive pads F_PD2 extending from the second conductive lines CL2. The first conductive pads F_PD1 may be disposed on the first pad area EA1 of the base film BF, and the second conductive pads F_PD2 may be disposed on the second pad area EA2 of the base film BF. The first conductive pads F_PD1 may be electrically connected to pads PD1_1 of the display panel DP, and the second conductive pads F_PD2 may be electrically connected to pads P_PD of the printed circuit board PCB. The pads P_PD may be disposed on a printed circuit board substrate PCB-BS.

As shown in FIG. 3C, the first pad area EA1 of the first flexible circuit film CF1 may be combined with the display panel DP, and the second pad area EA2 of the first flexible circuit film CF1 may be combined with the printed circuit board PCB. A first conductive adhesive film ACF1 may be interposed between the first pad area EA1 of the first flexible circuit film CF1 and the display panel DP. Accordingly, the first pad area EA1 of the first flexible circuit film CF1 may be fixed to the display panel DP by the first conductive adhesive film ACF1. The first conductive pads F_PD1 may be electrically connected to the pads PD_1 of the display panel DP by the first conductive adhesive film ACF1. A second conductive adhesive film ACF2 may be interposed between the second pad area EA2 of the first flexible circuit film CF1 and the printed circuit board PCB. Accordingly, the second pad area EA2 of the first flexible circuit film CF1 may be fixed to the printed circuit board PCB by the second conductive adhesive film ACF2. The second conductive pads F_PD2 may be electrically connected to the pads P_PD of the printed circuit board PCB by the second conductive adhesive film ACF2.

FIG. 3C shows the structure in which the first flexible circuit film CF1 may be combined with each of the display panel DP and the printed circuit board PCB by the first and second conductive adhesive films ACF1 and ACF2. However, the disclosure should not be limited thereto or thereby. For example, the first flexible circuit film CF1 may be combined with the display panel DP and the printed circuit board PCB by an ultrasonic bonding process.

The first flexible circuit film CF1 may further include a cover layer CVL provided in the center area MA to cover the first and second conductive lines CL1 and CL2. The cover layer CVL may not be provided in the first and second pad areas EA1 and EA2. Accordingly, the first and second conductive pads F_PD1 and F_PD2 may be exposed without being covered by the cover layer CVL. The cover layer CVL may be a solder resist layer.

As an example, the protrusion pattern PT1 may be disposed on the cover layer CVL. The protrusion pattern PT1 may extend along the first data driving chip DIC1. For example, the protrusion pattern PT1 may have a bar shape extending in the first direction DR1. In case that the first data driving chip DIC1 extends in the first direction DR1, the protrusion pattern PT1 may extend in the first direction DR1 and may be spaced apart from the first data driving chip DIC1 in the second direction DR2. The protrusion pattern PT1 may be disposed between the first data driving chip DIC1 and the first conductive pads F_PD1. In particular, the protrusion pattern PT1 may be disposed closer to the first conductive pads F_PD1 than the first data driving chip DIC1.

The protrusion pattern PT1 and the cover layer CVL may include a substantially same material. For example, the protrusion pattern PT1 may include a solder resist. FIG. 3B shows the structure in which the protrusion pattern PT1 may be provided as a layer independent from the cover layer CVL, however, the disclosure should not be limited thereto or thereby. For example, the protrusion pattern PT1 may be integrally formed with the cover layer CVL.

As shown in FIG. 3D, the protrusion pattern PT1 may include a metal pattern M_PT disposed on the cover layer CVL and an insulating pattern I_PT covering the metal pattern M_PT. The insulating pattern I_PT may be provided to cover the metal pattern M_PT. As an example, the metal pattern M_PT and the first and second conductive lines CL1 and CL2 may include a substantially same material. The insulating pattern I_PT and the cover layer CVL may include a substantially same material. For example, the metal pattern M_PT and the first conductive lines CL1 include a copper (Cu) material.

As described above, since each of the flexible circuit films CF1 to CF4 (refer to FIG. 1) may include the protrusion pattern PT1, the movement of each of the flexible circuit films CF1 to CF4 in the y-axis direction may be restricted. In particular, the protrusion pattern PT1 may be in physical contact with the side surface of the first display substrate FS of the display panel DP and restrict the movement of each of the flexible circuit films CF1 to CF4 in the y-axis direction. Accordingly, in case that the bonding process may be performed to combine the flexible circuit films CF1 to CF4 with the display panel DP, the first conductive pads F_PD1 of the flexible circuit films CF1 to CF4 may be easily aligned with the pads PD1_1 of the display panel DP in the y-axis direction. Therefore, a bonding reliability between the flexible circuit films CF1 to CF4 and the display panel DP may be improved. Particularly, although the flexible circuit films CF1 to CF4 may be deformed by heat generated during a process of mounting the data driving chips DIC1 to DIC4 on the flexible circuit films CF1 to CF4 respectively corresponding thereto, the alignment position of the flexible circuit films CF1 to CF4 with the display panel DP may be guided by the protrusion pattern PT1. Accordingly, deterioration in bonding reliability, which may be caused by misalignment, may be prevented.

Although not shown in figures, the first flexible circuit film CF1 may further include a dummy protrusion pattern disposed adjacent to the second conductive pads F_PD2. The dummy protrusion pattern may guide such that the second conductive pads F_PD2 of the flexible circuit films CF1 to CF4 may be easily aligned with leads of the printed circuit board PCB in the y-axis direction in case that the bonding process may be performed to combine the flexible circuit films CF1 to CF4 to the printed circuit board PCB. Accordingly, bonding reliability between the flexible circuit films CF1 to CF4 and the printed circuit board PCB may be improved.

Figure 4A:
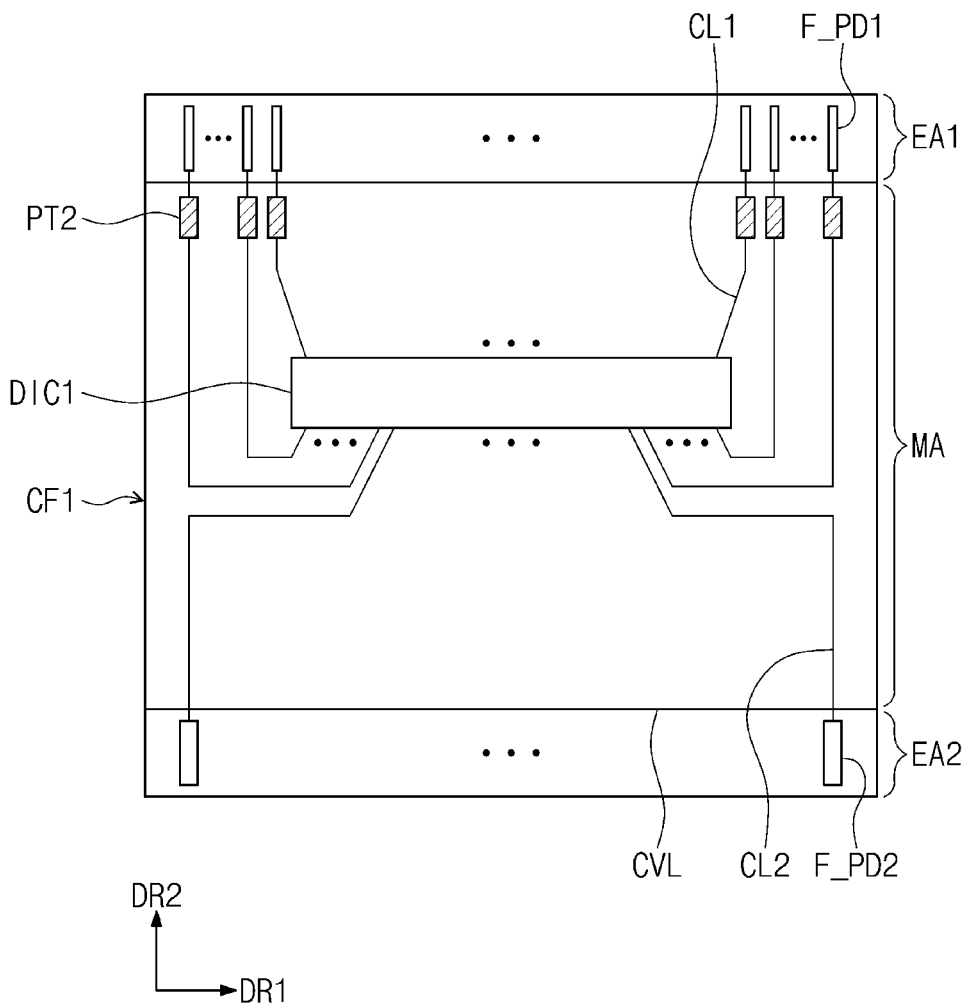
FIG. 4A is a schematic plan view showing a first flexible circuit film according to an embodiment of the disclosure.
Figure 4B:
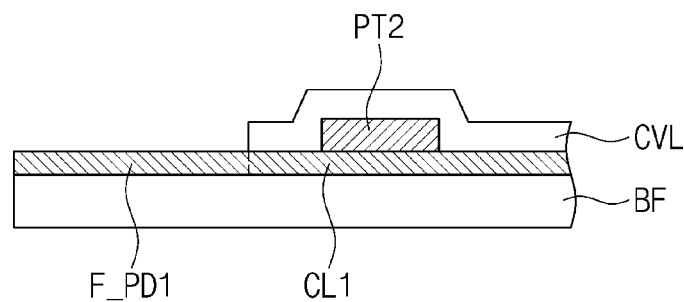
FIG. 4B is a partially enlarged schematic cross-sectional view showing the first flexible circuit film shown in FIG. 4A.

FIG. 4A is a schematic plan view showing a first flexible circuit film CF1 according to an embodiment of the disclosure, and FIG. 4B is a partially enlarged schematic cross-sectional view showing the first flexible circuit film shown in FIG. 4A. In FIGS. 4A and 4B, the same reference numerals denote the same elements in FIGS. 3A to 3C, and thus, detailed descriptions of the same elements will be omitted.

Referring to FIGS. 4A and 4B, the first flexible circuit film CF1 may further include protrusion patterns PT2. The protrusion patterns PT2 may be disposed on first conductive lines CL1 to respectively correspond to the first conductive lines CL1. In particular, the protrusion patterns PT2 may be electrically connected to the first conductive lines CL1, respectively. The protrusion patterns PT2 and the first conductive lines CL1 may include a substantially same metal material. As an example, the protrusion patterns PT2 and the first conductive lines CL1 may include a copper (Cu) material.

As shown in FIG. 4B, the protrusion patterns PT2 may be covered by a cover layer CVL. For example, the protrusion patterns PT2 may be disposed between the first conductive lines CL1 and the cover layer CVL.

Although not shown in figures, the first flexible circuit film CF1 may further include dummy protrusion patterns disposed on second conductive lines CL2 to be adjacent to second conductive pads F_PD2.

FIGS. 5A to 5E are schematic views showing processes of manufacturing the first flexible circuit film CF1 shown in FIG. 4B.

Figure 5A:
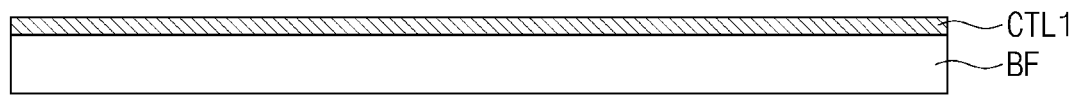
FIGS. 5A to 5E are schematic views showing processes of manufacturing the first flexible circuit film shown in FIG. 4B.

Referring to FIG. 5A, a first metal layer CTL1 may be disposed on a base film BF. The base film BF may include a polymer material, such as polyimide, polyester, or a combination thereof. The first metal layer CTL1 may include a metal material. As an example, the metal material may be a copper material.

Figure 5B:
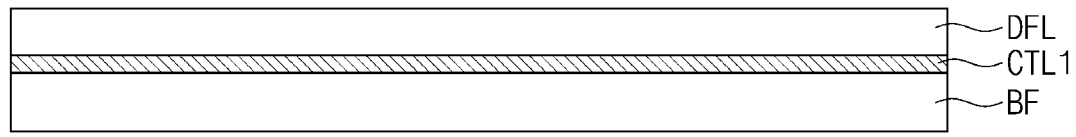
Figure 5C:
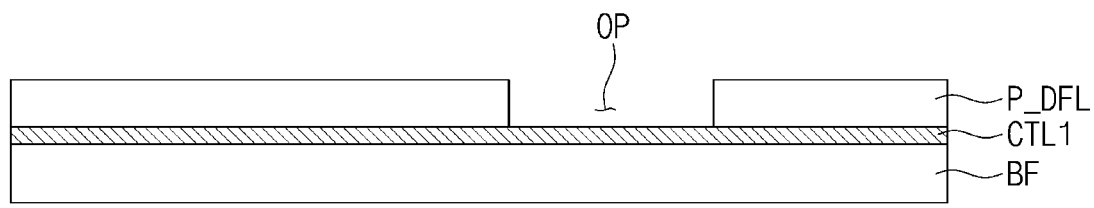

Referring to FIG. 5B, a photosensitive film DFL may be formed on the first metal layer CTL1. The photosensitive film DFL may be, but is not limited to, a dry film photoresist. The photosensitive film DFL may be exposed and developed, and as a result, a photosensitive pattern layer P_DFL through which opening patterns OP may be formed as shown in FIG. 5C may be formed. The opening patterns OP may be formed at positions corresponding to the protrusion patterns PT2 shown in FIGS. 4A and 4B.

Figure 5D:
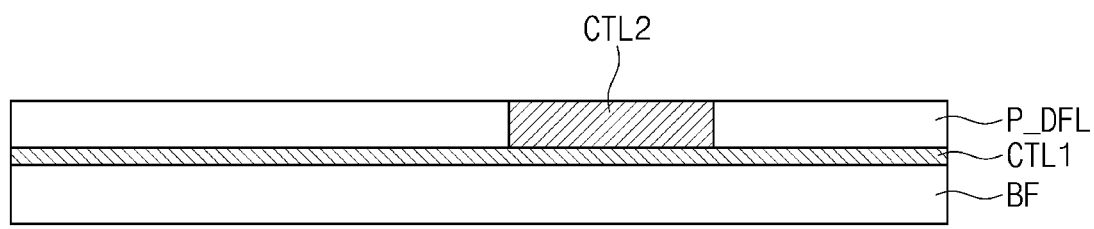

Referring to FIG. 5D, a second metal layer CTL2 may be formed in the opening patterns OP. The second metal layer CTL2 may be disposed on (e.g., directly on) the first metal layer CTL1.

Figure 5E:
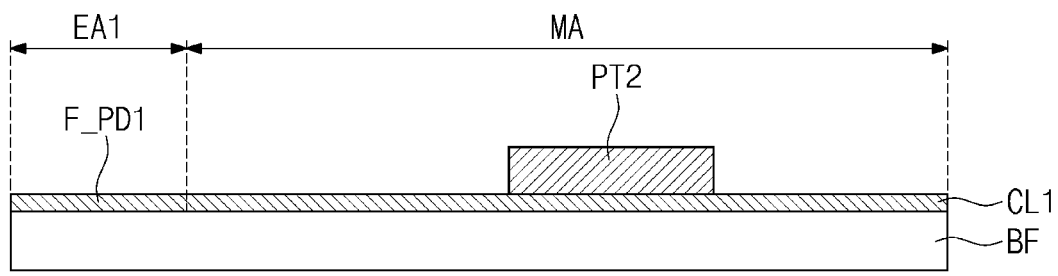

In case that the photosensitive pattern layer P_DFL is removed and the first and second metal layers CTL1 and CTL2 may be etched, the first conductive line CL1, the first conductive pad F_PD1, and the protrusion patterns PT2 may be provided on the base film BF as shown in FIG. 5E. For example, the protrusion patterns PT2 may be substantially simultaneously formed with the first conductive line CL1 and the first conductive pad F_PD1.

According to FIGS. 4A, 4B, and 5A to 5E, the structure in which the protrusion patterns PT2 are disposed on (e.g., directly on) the first conductive line CL1 has a high process efficiency compared with the structure in which the protrusion pattern PT1 (refer to FIGS. 3A to 3C) may be disposed on the cover layer CVL.

Figure 6A:
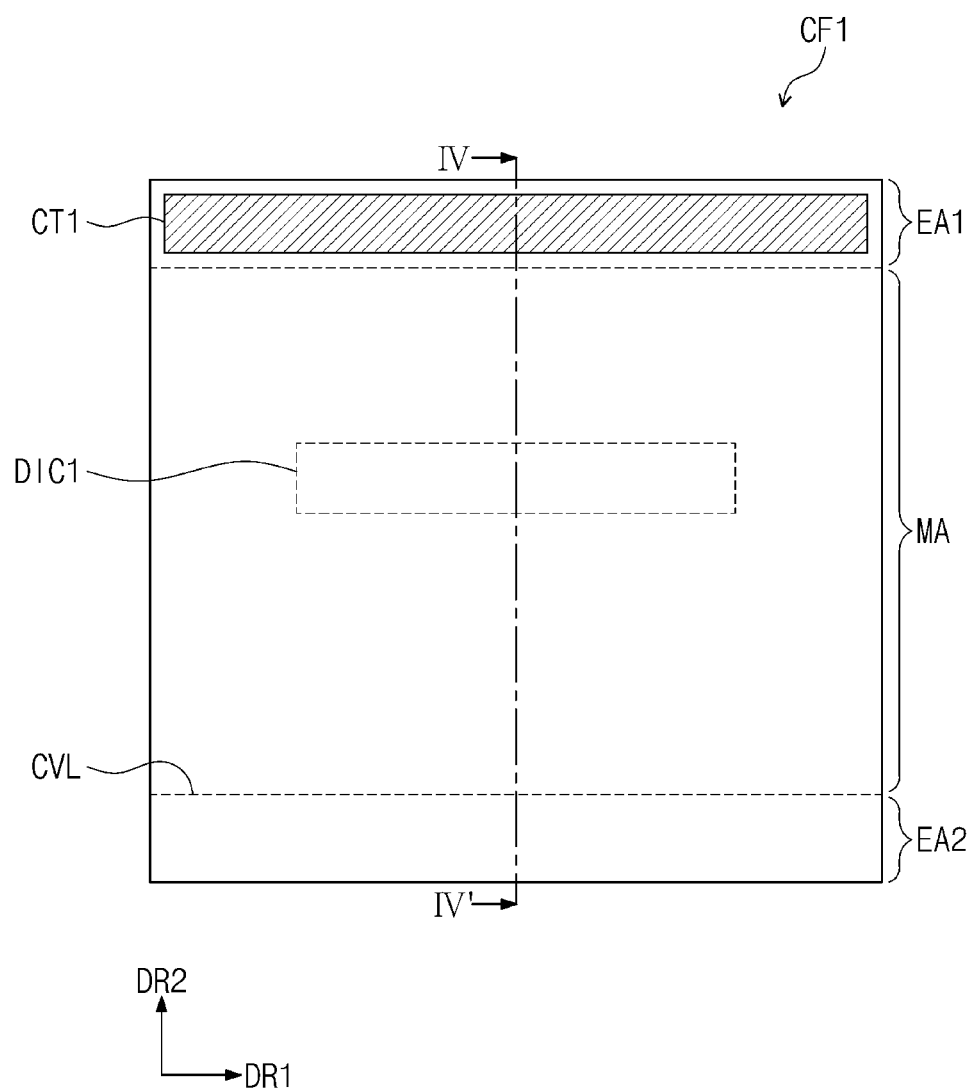
FIG. 6A is a schematic plan view showing a first flexible circuit film according to an embodiment of the disclosure.
Figure 6B:
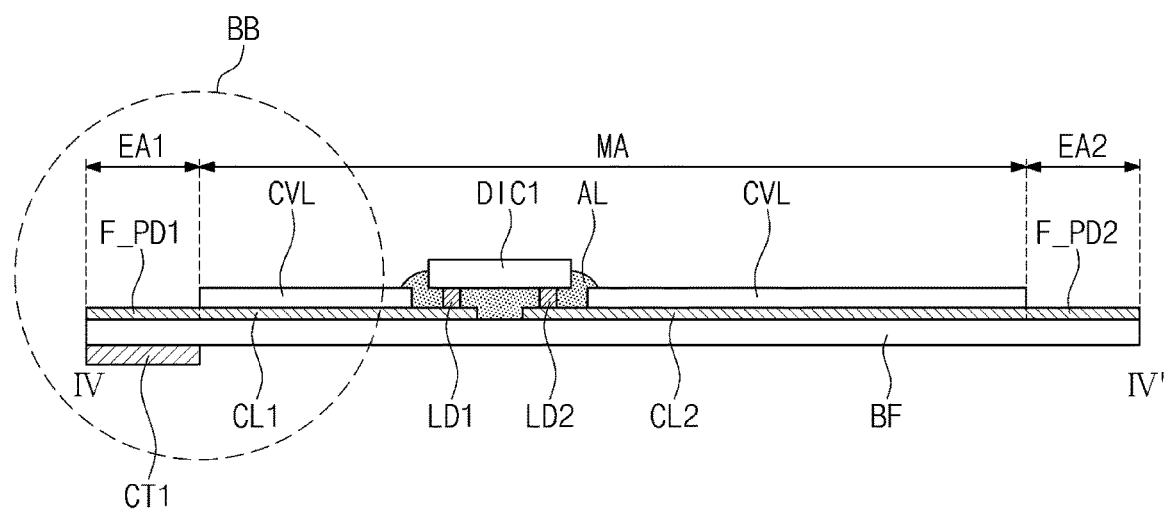
FIG. 6B is a schematic cross-sectional view taken along line IV-IV' shown in FIG. 6A.
Figure 6C:
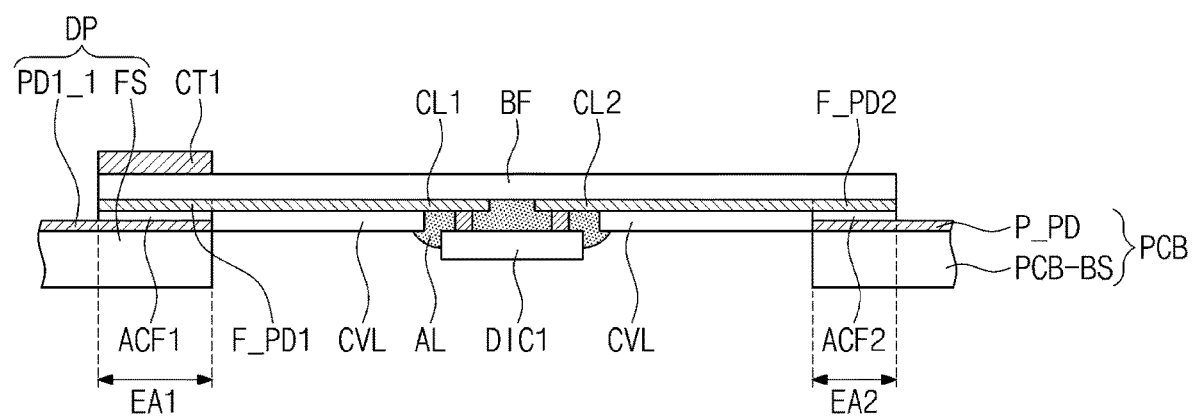
FIG. 6C is a schematic cross-sectional view showing a state in which the first flexible circuit film shown in FIG. 6A, the display panel, and a printed circuit board may be combined with each other.
Figure 6D:
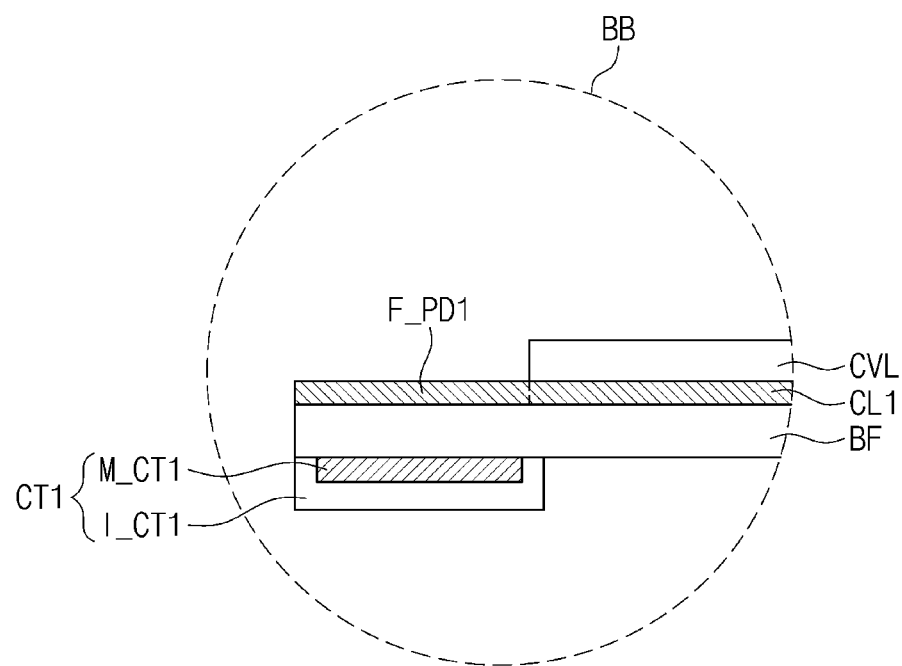
FIG. 6D is a partially enlarged schematic cross-sectional view showing portion BB shown in FIG. 6B.

FIG. 6A is a schematic plan view showing a first flexible circuit film CF1 according to an embodiment of the disclosure, and FIG. 6B is a schematic cross-sectional view taken along line IV-IV' shown in FIG. 6A. FIG. 6C is a schematic cross-sectional view showing a state in which the first flexible circuit film CF1 shown in FIG. 6A, a display panel, and a printed circuit board may be combined with each other, and FIG. 6D is a partially enlarged schematic cross-sectional view showing portion BB shown in FIG. 6B.

Referring to FIGS. 6A to 6D, the first flexible circuit film CF1 may include a center area MA, a first pad area EA1 disposed adjacent to a first side of the center area MA, and a second pad area EA2 disposed adjacent to a second side of the center area MA. A first data driving chip DIC1 may be mounted on the center area MA of the first flexible circuit film CF1.

First conductive lines CL1 may be electrically connected to the first data driving chip DIC1 in the center area MA, and second conductive lines CL2 may be electrically connected to the first data driving chip DIC1 in the center area MA. The first data driving chip DIC1 may include first bumps LD1 and second bumps LD2. The first bumps LD1 may be electrically connected to the first conductive lines CL1, respectively, and the second bumps LD2 may be electrically connected to the second conductive lines CL2, respectively. The first data driving chip DIC1 may be combined with the first flexible circuit film CF1 through an encapsulation adhesive layer AL.

The first flexible circuit film CF1 may further include first conductive pads F_PD1 extending from the first conductive lines CL1 and second conductive pads F_PD2 extending from the second conductive lines CL2. The first conductive pads F_PD1 may be disposed on the first pad area EA1 of a base film BF, and the second conductive pads F_PD2 may be disposed on the second pad area EA2 of the base film BF. The first conductive pads F_PD1 may be electrically connected to pads PD1_1 of a display panel DP, and the second conductive pads F_PD2 may be electrically connected to pads P_PD of a printed circuit board PCB.

The first flexible circuit film CF1 may further include a cover layer CVL disposed in the center area MA to cover the first and second conductive lines CL1 and CL2. The cover layer CVL may not be disposed in the first and second pad areas EA1 and EA2. Accordingly, the first and second conductive pads F_PD1 and F_PD2 may be exposed without being covered by the cover layer CVL. The cover layer CVL may be a solder resist layer.

The first flexible circuit film CF1 may further include a first compensation pattern CT1 disposed in the first pad area EA1. The first compensation pattern CT1 may be disposed on a back surface (or a second surface) of the base film BF. In detail, the first and second conductive lines CL1 and CL2 may be disposed on a front surface (or a first surface) of the base film BF, and the first compensation pattern CT1 may be disposed on the back surface of the base film BF opposite to the front surface of the base film BF.

The first compensation pattern CT1 may be disposed in the first pad area EA1 to overlap the first conductive pads F_PD1. The first compensation pattern CT1 may extend in a direction, e.g., the first direction DR1, in which the first conductive pads F_PD1 may be arranged. The first compensation pattern CT1 may have a bar shape extending in a longitudinal direction of the first data driving chip DIC1 and may be disposed to be spaced apart from the first data driving chip DIC1 in the second direction DR2.

The first compensation pattern CT1 may have a structure protruding from the back surface of the base film BF. For example, as an example, the first compensation pattern CT1 may be integrally formed with the base film BF. However, the structure of the first compensation pattern CT1 according to the disclosure should not be limited thereto or thereby. As shown in FIG. 6D, the first compensation pattern CT1 may include a first metal pattern M_CT1 and a first insulating pattern I_CT1 covering the first metal pattern M_CT1. The first metal pattern M_CT1 may be disposed on (e.g., directly on) the back surface of the base film BF, and the first insulating pattern I_CT1 may be provided to cover the first metal pattern M_CT1. As an example, the first metal pattern M_CT1 and the first and second conductive lines CL1 and CL2 may include a substantially same material. The first insulating pattern I_CT1 and the cover layer CVL may include a substantially same material. For example, the first metal pattern M_CT1 and the first conductive lines CL1 include a copper (Cu) material.

As another example, the first compensation pattern CT1 may include only the first insulating pattern I_CT1. The first insulating pattern I_CT1 and the cover layer CVL may include a substantially same material.

In case that the first compensation pattern CT1 is provided on the back surface of the base film BF to overlap the first conductive pads F_PD1, a thickness of the first flexible circuit film CF1 may increase in the first pad area EA1. As a result, in a case where the first flexible circuit film CF1 may be deformed due to heat, flexural deformation in the first pad area EA1 may be reduced. In case that the first compensation pattern CT1 further includes the first metal pattern M_CT1 that may be more resistant to heat than the cover layer CVL or the base film BF, deformation caused by the heat may be prevented.

As shown in FIG. 6C, the first pad area EA1 of the first flexible circuit film CF1 may be combined with the display panel DP, and the second pad area EA2 of the first flexible circuit film CF1 may be connected to the printed circuit board PCB. For example, the first compensation pattern CT1 may overlap a first display substrate FS of the display panel DP in the first pad area EA1 after the flexible circuit films CF1 to CF4 (refer to FIG. 1) may be combined with the display panel DP.

According to an embodiment of the disclosure, as the first compensation pattern CT1 may be provided in the first pad area EA1, deformation of the first flexible circuit film CF1 may be reduced or prevented. As a result, misalignment between the first conductive pads F_PD1 of the first flexible circuit film CF1 and data pads of the display panel DP may be prevented. Accordingly, bonding reliability between the first flexible circuit film CF1 and the display panel DP may be improved.

Figure 7A:
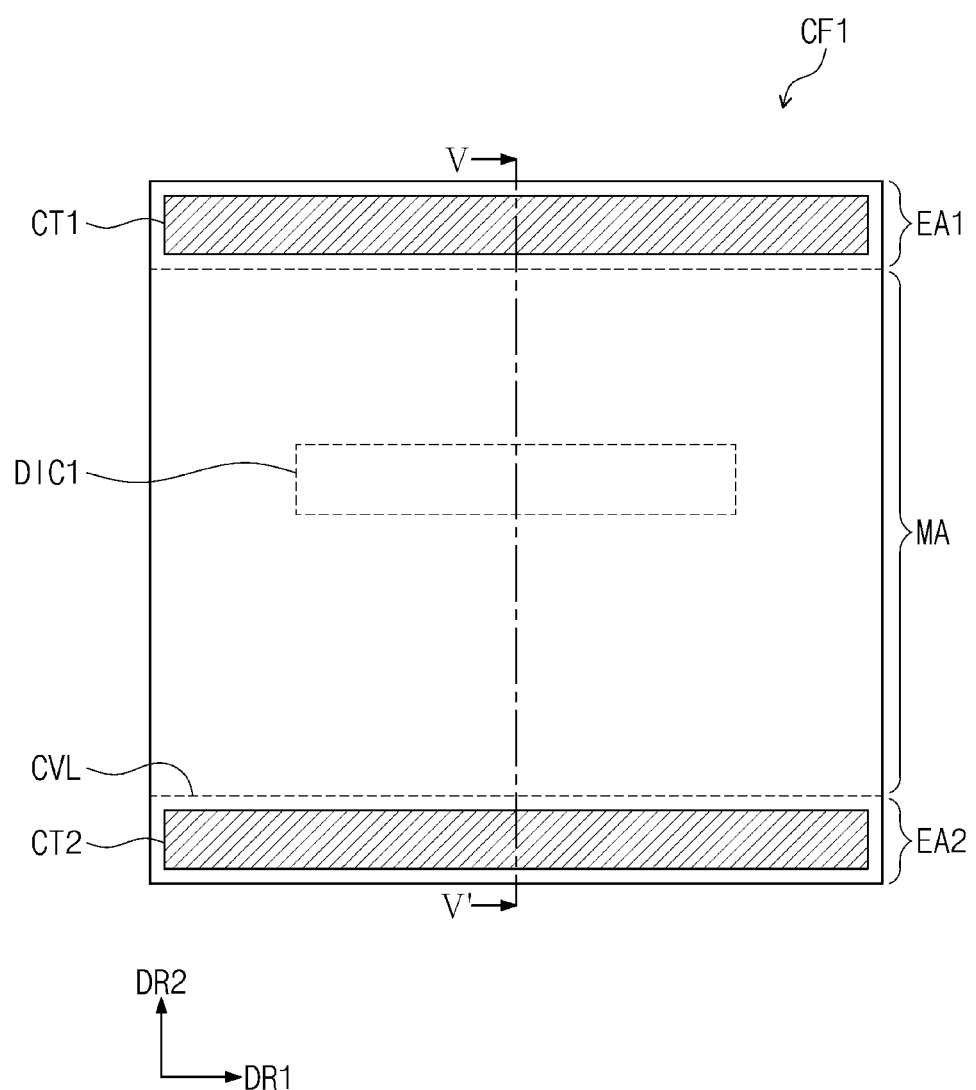
FIG. 7A is a schematic plan view showing a first flexible circuit film according to an embodiment of the disclosure.
Figure 7B:
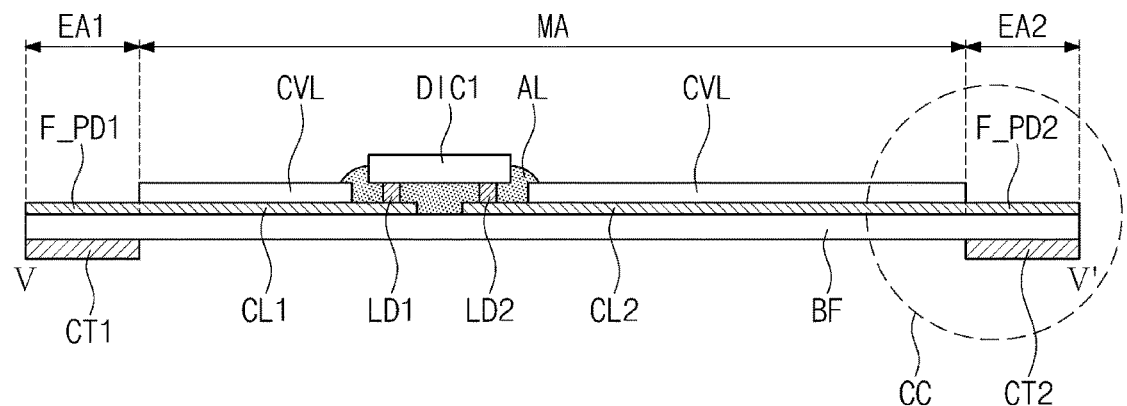
FIG. 7B is a schematic cross-sectional view taken along line V-V' shown in FIG. 7A.
Figure 7C:
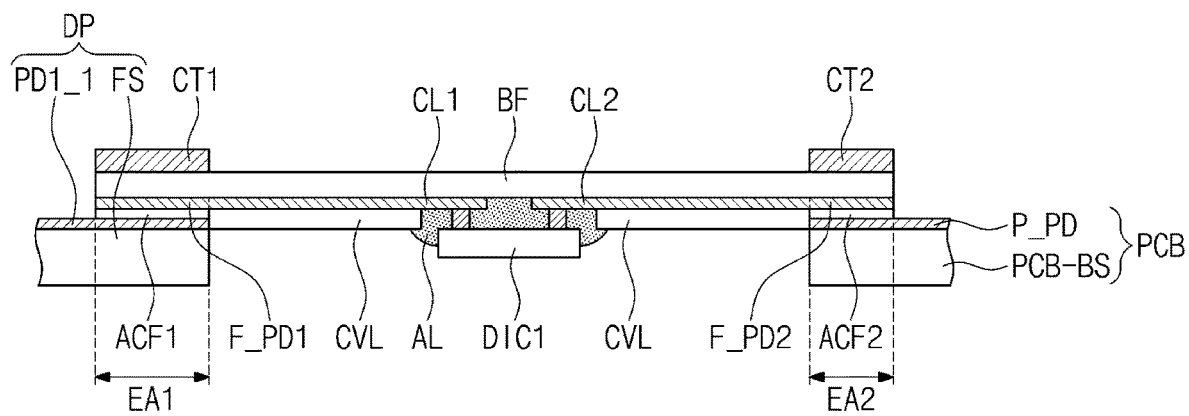
FIG. 7C is a schematic cross-sectional view showing a state in which the first flexible circuit film shown in FIG. 7A, the display panel, and a printed circuit board may be combined with each other.
Figure 7D:
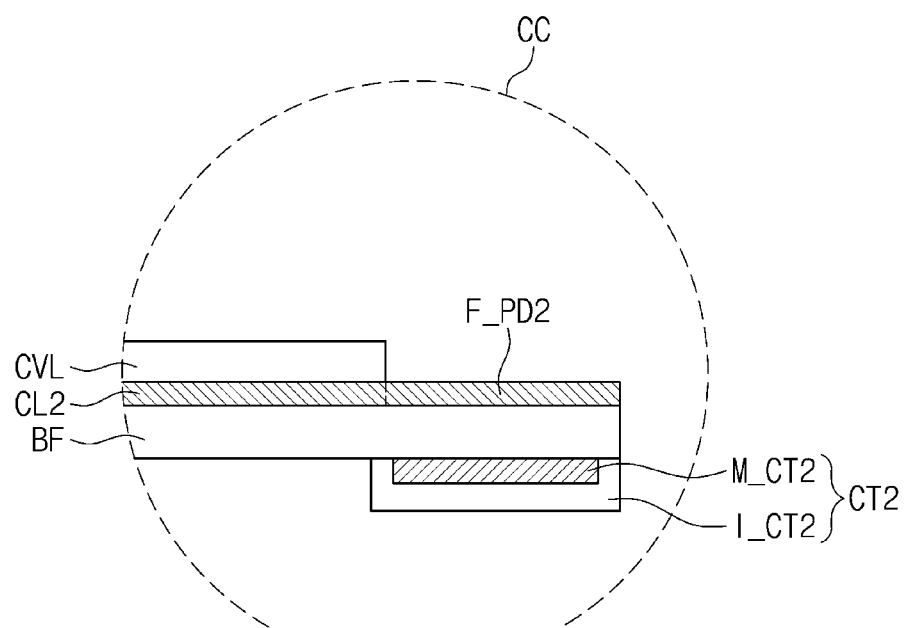
FIG. 7D is a partially enlarged schematic cross-sectional view showing portion CC shown in FIG. 7B.

FIG. 7A is a schematic plan view showing a first flexible circuit film according to an embodiment of the disclosure, and FIG. 7B is a schematic cross-sectional view taken along line V-V' shown in FIG. 7A. FIG. 7C is a schematic cross-sectional view showing a state in which the first flexible circuit film shown in FIG. 7A, a display panel, and a printed circuit board may be combined with each other, and FIG. 7D is a partially enlarged schematic cross-sectional view showing portion CC shown in FIG. 7B.

Referring to FIGS. 7A to 7D, the first flexible circuit film CF1 may further include a second compensation pattern CT2 provided in a second pad area EA2. The second compensation pattern CT2 may be disposed on a back surface of a base film BF with a first compensation pattern CT1. In detail, first and second conductive lines CL1 and CL2 may be disposed on a front surface of the base film BF, and the first and second compensation patterns CT1 and CT2 may be disposed on the back surface of the base film BF opposite to the front surface of the base film BF.

The second compensation pattern CT2 may be disposed in the second pad area EA2 to overlap second conductive pads F_PD2. The second compensation pattern CT2 may extend in a direction, e.g., the first direction DR1, in which the second conductive pads F_PD2 may be arranged. The second compensation pattern CT2 may have a bar shape extending in a longitudinal direction of a first data driving chip DIC1 and may be disposed to be spaced apart from the first data driving chip DIC1 in the second direction DR2. The second compensation pattern CT2 may be disposed to be substantially parallel to the first compensation pattern CT1.

The second compensation pattern CT2 may have a structure protruding from the back surface of the base film BF. For example, the second compensation pattern CT2 may be integrally formed with the base film BF. However, the structure of the second compensation pattern CT2 according to the disclosure should not be limited thereto or thereby. As shown in FIG. 7D, the second compensation pattern CT2 may include a second metal pattern M_CT2 and a second insulating pattern I_CT2 covering the second metal pattern M_CT2. The second metal pattern M_CT2 may be disposed on (e.g., directly on) the back surface of the base film BF, and the second insulating pattern I_CT2 may be provided to cover the second metal pattern M_CT2. As an example, the second metal pattern M_CT2 and the first and second conductive lines CL1 and CL2 may include a substantially same material. The second insulating pattern I_CT2 and a cover layer CVL may include a substantially same material. For example, the second metal pattern M_CT2 and the first conductive lines CL1 may include a copper (Cu) material.

As another example, the second compensation pattern CT2 may include only the second insulating pattern I_CT2. The second insulating pattern I_CT2 and the cover layer CVL may include a substantially same material.

As shown in FIG. 7C, a first pad area EA1 of the first flexible circuit film CF1 may be combined with the display panel DP, and the second pad area EA2 of the first flexible circuit film CF1 may be connected to the printed circuit board PCB. For example, after the flexible circuit films CF1 to CF4 (refer to FIG. 1) may be combined with the display panel DP, the first compensation pattern CT1 may overlap a first display substrate FS of the display panel DP in the first pad area EA1, and the second compensation pattern CT2 may overlap the printed circuit board PCB in the second pad area EA2.

As described above, since the first and second compensation patterns CT1 and CT2 may be respectively provided in the first and second pad areas EA1 and EA2, deformation of the first flexible circuit film CF1 may be reduced or prevented. As deformation of the first flexible circuit film CF1 may be reduced or prevented, misalignment between the first flexible circuit film CF1 and the display panel DP and misalignment between the first flexible circuit film CF1 and the printed circuit board PCB may be prevented. Accordingly, bonding reliability between the first flexible circuit film CF1 and the display panel DP and between the first flexible circuit film CF1 and the printed circuit board PCB may be improved.

Figure 8A:
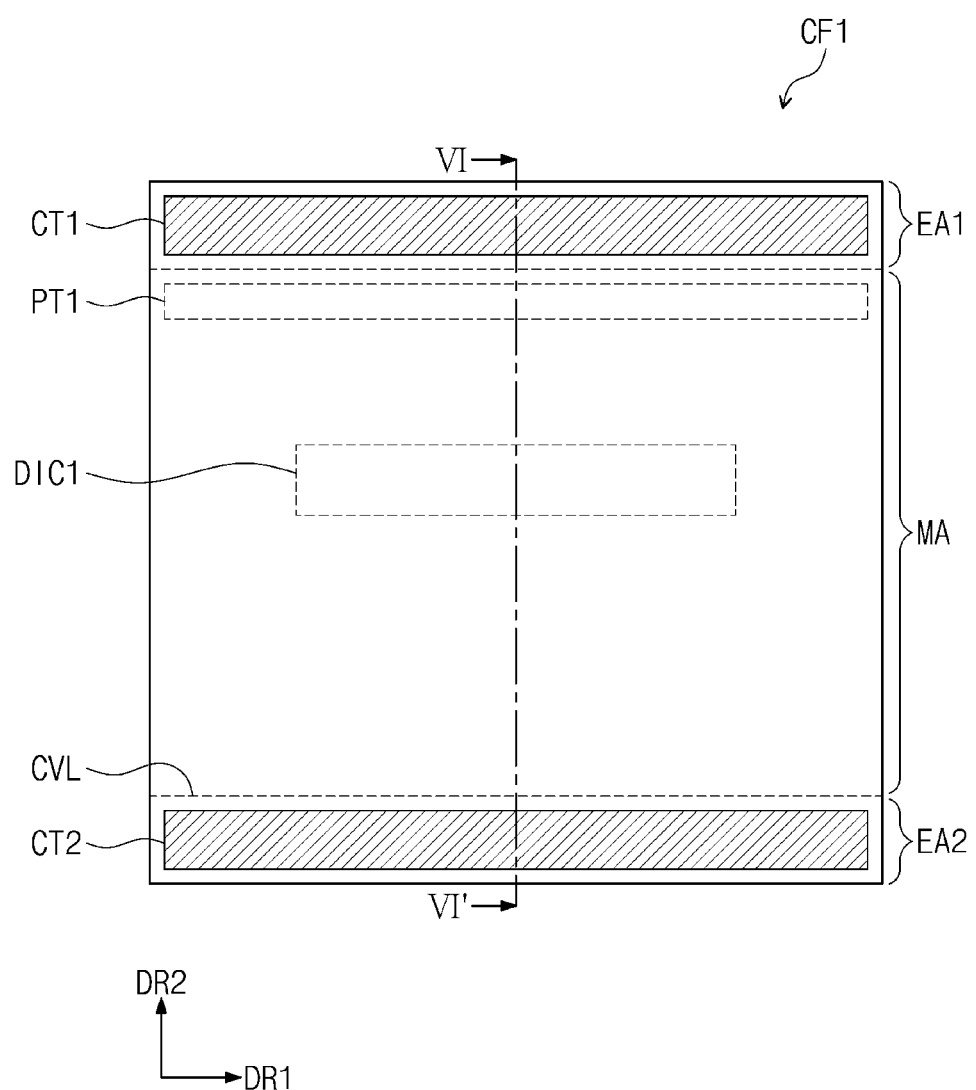
FIG. 8A is a schematic plan view showing a first flexible circuit film according to an embodiment of the disclosure.
Figure 8B:
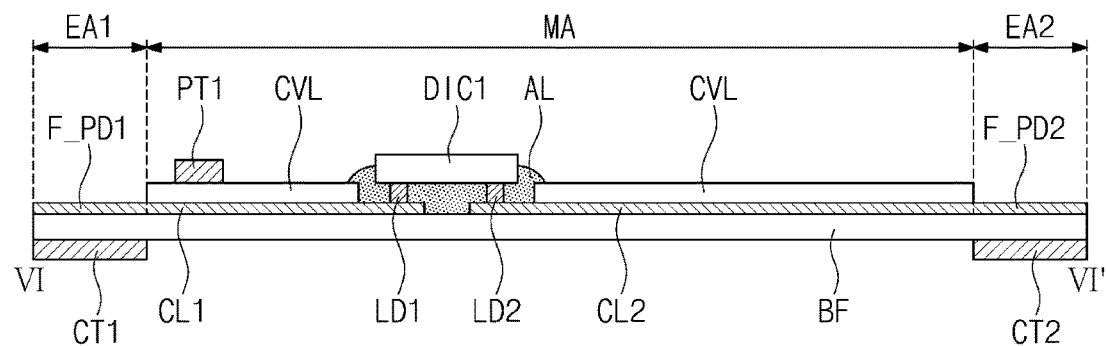
FIG. 8B is a schematic cross-sectional view taken along line VI-VI' shown in FIG. 8A.
Figure 8C:
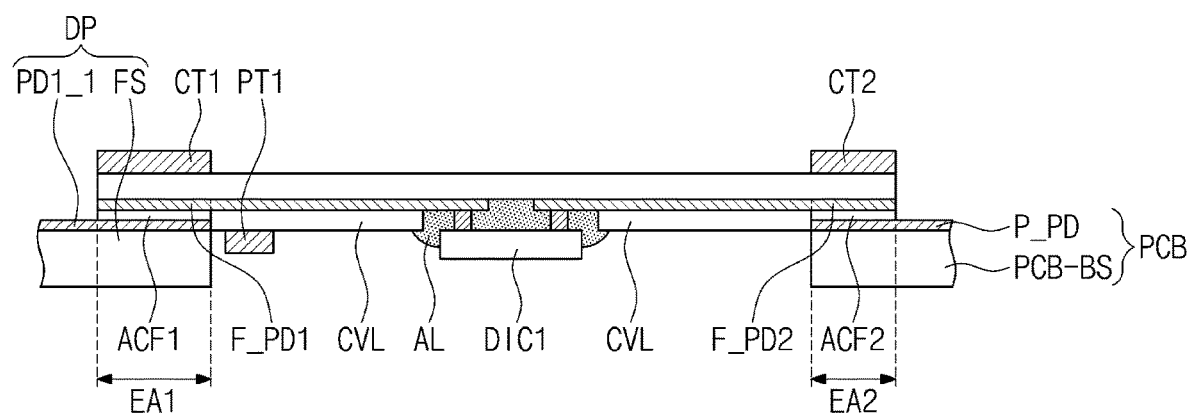
FIG. 8C is a schematic cross-sectional view showing a state in which the first flexible circuit film shown in FIG. 8A, the display panel, and a printed circuit board may be combined with each other.

FIG. 8A is a schematic plan view showing a first flexible circuit film according to an embodiment of the disclosure, FIG. 8B is a schematic cross-sectional view taken along line VI-VI' shown in FIG. 8A, and FIG. 8C is a schematic cross-sectional view showing a state in which the first flexible circuit film shown in FIG. 8A, a display panel, and a printed circuit board may be combined with each other.

Referring to FIGS. 8A to 8C, the first flexible circuit film CF1 may further include a protrusion pattern PT1 in a center area MA. The protrusion pattern PT1 may be disposed between first and second compensation patterns CT1 and CT2. The first and second compensation patterns CT1 and CT2 may be disposed on a back surface of a base film BF, and the protrusion pattern PT1 may be disposed on a cover layer CVL.

In an embodiment, the structure in which the protrusion pattern PT1 may be disposed between the first compensation pattern CT1 and a first data driving chip DIC1 may be shown as a representative example, however, the disclosure should not be limited thereto or thereby. For example, the protrusion pattern PT1 may be disposed between the second compensation pattern CT2 and the first data driving chip DIC1. The first flexible circuit film CF1 may further include a dummy protrusion pattern disposed between the second compensation pattern CT2 and the first data driving chip DIC1 in addition to the protrusion pattern PT1 disposed between the first compensation pattern CT1 and the first data driving chip DIC1.

As described above, since each of the flexible circuit films CF1 to CF4 (refer to FIG. 1) may include the protrusion pattern PT1, the movement of each of the flexible circuit films CF1 to CF4 in the y-axis direction may be restricted. In particular, the protrusion pattern PT1 may be in physical contact with a side surface of a first display substrate FS of the display panel DP and restricts the movement of each of the flexible circuit films CF1 to CF4 in the y-axis direction. Accordingly, in case that the bonding process is performed to combine the flexible circuit films CF1 to CF4 with the display panel DP, first conductive pads F_PD1 of the flexible circuit films CF1 to CF4 may be easily aligned with pads PD1_1 of the display panel DP in the y-axis direction. Therefore, bonding reliability between the flexible circuit films CF1 to CF4 and the display panel DP may be improved.

Figure 9A:
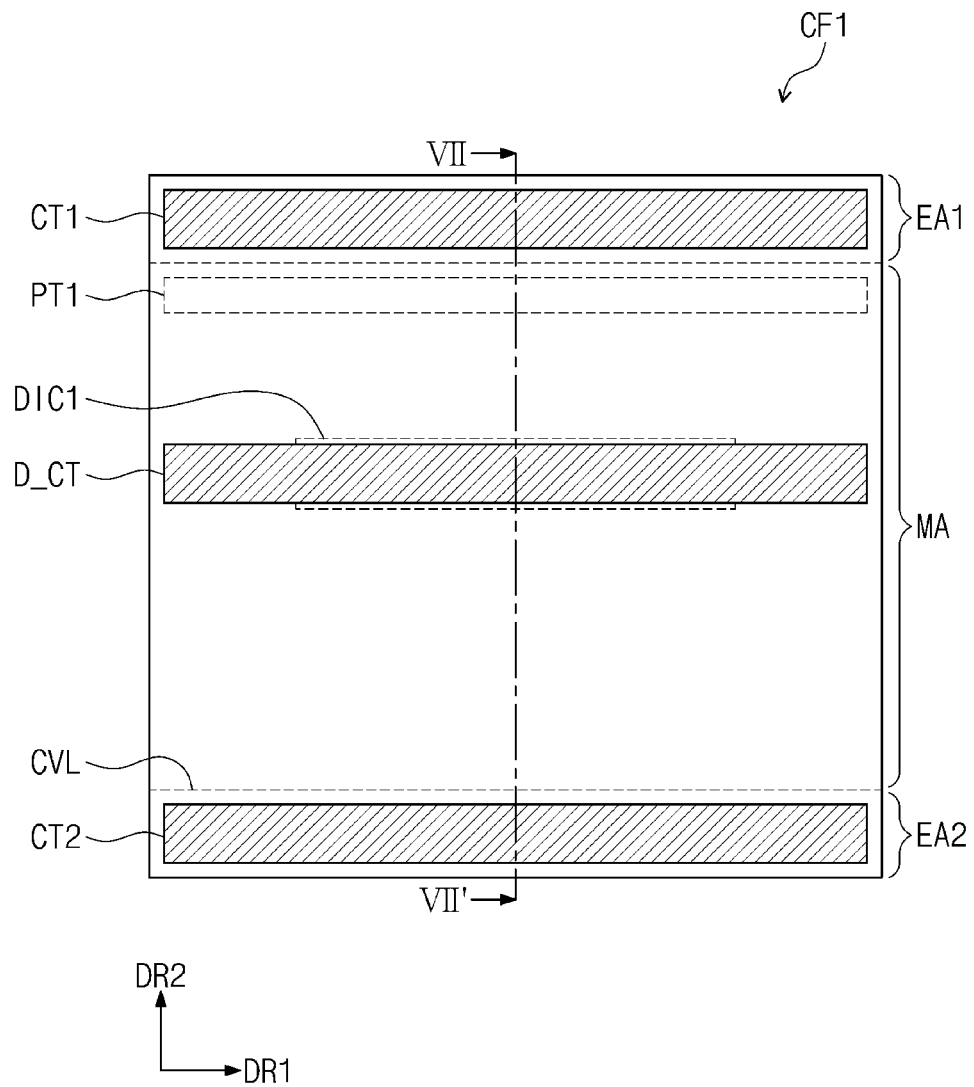
FIG. 9A is a schematic plan view showing a first flexible circuit film according to an embodiment of the disclosure.
Figure 9B:
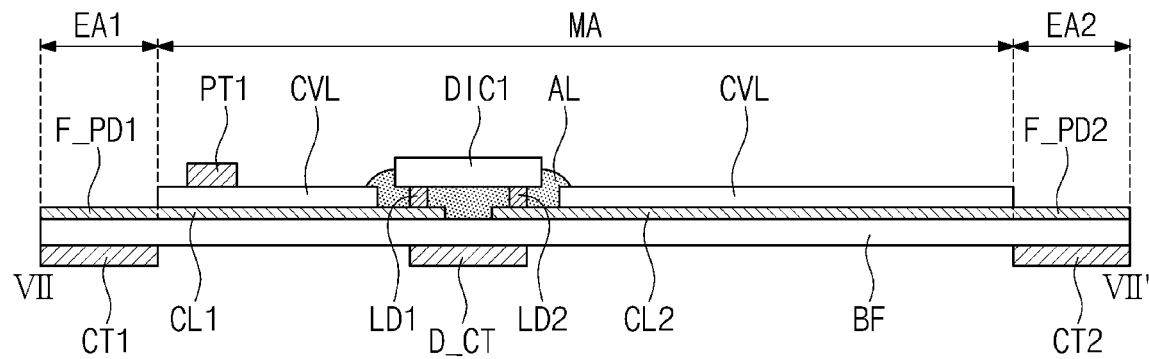
FIG. 9B is a schematic cross-sectional view taken along line VII-VII' shown in FIG. 9A.

FIG. 9A is a schematic plan view showing a first flexible circuit film according to an embodiment of the disclosure, and FIG. 9B is a schematic cross-sectional view taken along line VII-VII' shown in FIG. 9A.

Referring to FIGS. 9A and 9B, the first flexible circuit film CF1 may further include a dummy compensation pattern D_CT disposed between first and second compensation patterns CT1 and CT2. The dummy compensation pattern D_CT may be disposed on a back surface of a base film BF to correspond to a center area MA. The dummy compensation pattern D_CT and at least one of the first and second compensation patterns CT1 and CT2 may have a substantially same configuration.

The dummy compensation pattern D_CT may overlap a first data driving chip DIC1 in the center area MA. The dummy compensation pattern D_CT may have a bar shape extending along the first data driving chip DIC1 in the first direction DR1. The dummy compensation pattern D_CT may be disposed to be spaced apart from the first and second compensation patterns CT1 and CT2 in the second direction DR2.

In case that the first flexible circuit film CF1 includes the dummy compensation pattern D_CT, it may be more efficient to prevent flexural deformation in the center area MA compared to a structure including only at least one of the first and second compensation patterns CT1 and CT2.

Although embodiments of the disclosure have been described, it is understood that the disclosure should not be limited to these embodiments. Rather, various changes and modifications can be made by one of ordinary skill in the art without departing from the spirit and scope of the disclosure as hereinafter claimed.

Therefore, the disclosed subject matter should not be limited to any single embodiment described herein, and the scope of the inventive concept shall be determined according to the attached claims including equivalents thereof.

What is claimed is:

1. A display device comprising:
a display panel comprising:
a pixel layer displaying an image; and
a pad part electrically connected to the pixel layer;
a flexible circuit film combined with the pad part of the display panel; and
a driving chip disposed on the flexible circuit film,
wherein the flexible circuit film comprises:
a base film;
a first conductive line disposed on a first surface of the base film;
a first conductive pad extending from the first conductive line and electrically connected to the pad part of the display panel;
a cover layer covering the first conductive line and exposing the first conductive pad; and
a protrusion pattern disposed on the cover layer, adjacent to the first conductive pad, and facing a side surface of the display panel,
wherein the protrusion pattern has a bar shape extending along the driving chip.

2. A display device comprising:
a display panel comprising:
a pixel layer displaying an image; and
a pad part electrically connecter the pixel layer; and
a flexible circuit film combined with the pad part of the display panel, the flexible circuit film comprising
a base in;
a first conductive line disposed on a first surface of the base film;
a first conductive pad extending from the first conductive line and electrical connected to the pad part of the display panel;
a cover layer covering the conductive line and exposing the first conductive pad; and
a protrusion pattern disposed on the cover layer, adjacent to the first conductive pad, and facing a side surface of the display panel,
wherein the protrusion pattern comprises:
a metal pattern disposed on the cover layer; and
an insulating pattern covering the metal pattern.

3. The display device of claim 2, wherein the metal pattern, the first conductive line, and the first conductive pad comprise a same material.

4. The display device of claim 2, wherein the insulating pattern and the cover layer comprise a same material.

5. A display device comprising:
a display panel comprising:
a pixel layer displaying an image; and
a pad part electrically connected to the pixel layer; and
a flexible circuit combined with the pad part of the display panel, the flexible circuit film comprising:
a base film,
a first conductive line disposed on a first surface of the base film;
a first conductive pad extending from the first conductive line and electrically connected to the pad part of the display panel;
a cover layer covering the first conductive line and exposing the first conductive pad, and
a protrusion pattern disposed on the cover layer, adjacent to the first conductive pad, and facing a side surface of the display panel,
wherein the protrusion pattern has an integral structure with the cover layer.

6. The display device of claim 1, wherein the flexible circuit film further comprises a first compensation pattern disposed on a second surface of the base film and overlapping the first conductive pad, the second surface of the base film being opposite to the first surface of the base film.

7. The display device of claim 6, wherein the first compensation pattern comprises:
a first metal pattern disposed on the second surface of the base film; and
a first insulating pattern covering the first metal pattern.

8. The display device of claim 7, wherein the first metal pattern, the first conductive line, and the first conductive pad comprise a same material.

9. The display device of claim 7, wherein the first insulating pattern and the cover layer comprise a same material.

10. The display device of claim 1, further comprising a printed circuit board combined with the flexible circuit film.

11. The display device of claim 10, wherein the flexible circuit film comprises:
- a second conductive line disposed on the first surface of the base film; and
- a second conductive pad extending from the second conductive line and combined with the printed circuit board.

12. The display device of claim 11, wherein the flexible circuit film further comprises a second compensation pattern disposed on a second surface of the base film and overlapping the second conductive pad, the second surface of the base film being opposite to the first surface of the base film.

13. The display device of claim 12, wherein the second compensation pattern comprises:
- a second metal pattern disposed on the second surface of the base film; and
- a second insulating pattern covering the second metal pattern.

14. The display device of claim 1, wherein
the flexible circuit film comprises a first compensation pattern and a second compensation pattern that are spaced apart from each other, and
the driving chip is disposed between the first compensation pattern and the second compensation pattern.

15. The display device of claim 14, wherein the first compensation pattern and the second compensation pattern have a bar shape extending along the driving chip.

16. A display device comprising:
a display panel comprising:
- a pixel layer displaying an image; and
- a pad part electrically connected to the pixel layer;
a flexible circuit film combined with the pad part of the display panel; and
a printed circuit board combined with the flexible circuit film,
wherein the flexible circuit film comprises:
- a base film;
- a first conductive line disposed on a first surface of the base film;
- a first conductive pad extending from the first conductive line and electrically connected to the pad part of the display panel;
- a cover layer covering the first conductive line and exposing the first conductive pad; and
- a first compensation pattern disposed on a second surface of the base film, the second surface of the base film being opposite to the first surface of the base film,
wherein
the first compensation pattern includes a portion that is not integral to the base film.

17. The display device of claim 16, wherein the first compensation pattern overlaps the first conductive pad.

18. The display device of claim 17, wherein the flexible circuit film further comprises:
- a second conductive line disposed on the first surface of the base film;
- a second conductive pad extending from the second conductive line and combined with the printed circuit board; and
- a second compensation pattern disposed on the second surface of the base film and overlapping the second conductive pad.

19. The display device of claim 16, wherein the first compensation pattern includes an insulating film disposed on the base film.

20. The display device of claim 16, wherein the first compensation pattern includes a metal pattern is disposed on the base film.

21. The display device of claim 16, wherein the first compensation pattern includes a metal pattern and an insulating pattern covering the metal pattern.

22. The display device of claim 21, wherein the metal pattern is disposed directly on the base film.

\* \* \* \* \*